United States Patent [19]

Gorin

[11] Patent Number: 4,464,223
[45] Date of Patent: Aug. 7, 1984

[54] PLASMA REACTOR APPARATUS AND METHOD

[75] Inventor: Georges J. Gorin, Pinole, Calif.

[73] Assignee: Tegal Corp., Novato, Calif.

[21] Appl. No.: 538,593

[22] Filed: Oct. 3, 1983

[51] Int. Cl.³ .................... H01L 21/312; B44C 1/22; C03C 15/00; C23F 1/02
[52] U.S. Cl. .................... 156/643; 156/646; 156/345; 204/192 E; 204/298
[58] Field of Search .................... 204/298, 192 E, 164; 156/643, 646, 345, 657, 656, 659.1, 662, 665; 427/38, 39

[56] References Cited

U.S. PATENT DOCUMENTS

| | | | |
|---|---|---|---|
| 4,233,109 | 11/1980 | Nishizawa | 156/345 X |
| 4,349,409 | 9/1982 | Shibayama et al. | 156/643 |
| 4,352,725 | 10/1982 | Tsukada | 204/192 E |
| 4,399,016 | 8/1983 | Tsukada et al. | 204/192 R |

Primary Examiner—William A. Powell

[57] ABSTRACT

An improved plasma reactor apparatus and method are disclosed. Improved uniformity of etching and etch rate are achieved in a reactor through the use of electrodes powered at high and low frequencies. In one embodiment of the invention the workpiece which is to be etched rests on an electrode powered at a low AC frequency of about 100 KHz. A second electrode is powered at a high AC frequency of about 13.56 MHz. A third electrode is maintained at ground potential. High and low frequency AC fields acting on a reactant material optimize the dissociation of the reactant material and the ion energy of the plasma generated reactant species.

11 Claims, 4 Drawing Figures

PLASMA REACTOR APPARATUS AND METHOD

BACKGROUND OF THE INVENTION

This invention relates to an improved plasma reactor apparatus and method, and more specifically to a multiple frequency plasma reactor apparatus and to a method for etching workpieces within that apparatus.

Plasma etching and reactive ion etching (RIE) have become important processes in the precision etching of certain workpieces such as in the fabrication of semiconductor devices. Differences in the two processes, which generally can be carried out in the same equipment, result from different pressure ranges employed and from the consequent differences in mean free path of excited reactant species. The two processes will herein be referred to collectively as plasma etching. Plasma etching is a "dry etching" technique and has a number of advantages over conventional wet etching in which the workpiece is generally immersed in a container of liquid etchant material. Some of the advantages include lower cost, reduced pollution problems, reduced contact with dangerous chemicals, increased dimensional control, increased uniformity, improved etch selectivity, and increased process flexibility. In existing plasma etch systems, however, it has not generally been possible to simultaneously achieve all of these advantages. A need therefore existed for equipment and process which would make several of the foregoing advantages simultaneously attainable.

It is therefore an object of this invention to provide an improved plasma reactor apparatus.

It is another object of this invention to provide an improved plasma etch process which enhances process flexibility.

It is another object of this invention to provide an improved plasma process which provides a higher degree of control over ion density and ion energy than previously practical.

It is a still further object of this invention to provide an improved plasma reactor apparatus, and a process for practice in that apparatus, which provides an improved uniformity of etch, improved etch selectivity, and improved dimensional control.

BRIEF SUMMARY OF THE INVENTION

The foregoing and other objects and advantages are achieved in the present invention through the use of a multiple frequency plasma reactor apparatus. The plasma reactor apparatus includes three electrodes. One of the electrodes is held at ground while the second is selectively coupled to a high frequency AC source and the third is selectively coupled to a low frequency AC source. A plasma generated by the high and/or low frequency electric fields established between the electrodes creates excited species of the reactants injected into the apparatus. The excited species act to precisely etch a workpiece positioned within the reactor.

DETAILED DESCRIPTION OF PREFERRED EMBODIMENTS

Figure 1:
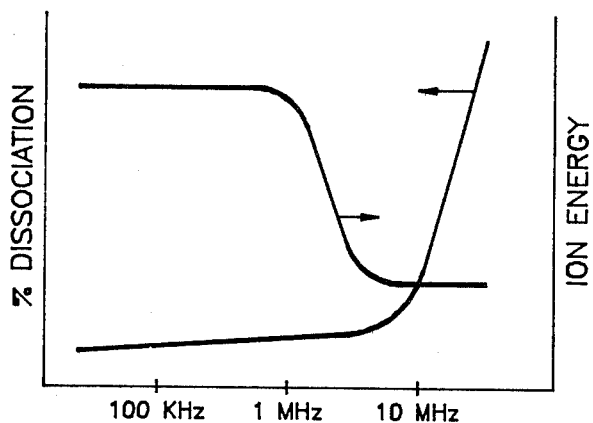
FIG. 1 illustrates percentage dissociation and ion energy as a function of plasma frequency.

In the nomenclature associated with plasma reactors and plasma processes, it is common to describe as "high frequency" any frequency greater than about 10 MHz. "Low frequency" is correspondingly used to describe any frequency less than about 1 MHz. The frequency of RF power applied to a reactant gas has an appreciable effect on the plasma that is generated from that gas. FIG. 1 illustrates, for example, the effect of frequency on the amount of dissociation that occurs in the reactant gas making up the plasma. The dissociation remains low until the frequency exceeds about 10 MHz. FIG. 1 also illustrates the effect of frequency on the energy of the ions generated in the plasma. The ion energy is generally high at low frequencies and falls off rapidly as the frequency is increased. The amount of dissociation of the reactant gas and the energy of the ions within the plasma have a marked effect on the uniformity of etching and also upon the rate of etching. The uniformity of etch is a strong function of the high frequency power while etch rate, for example in the case of oxide etching, is a strong function of low frequency power.

A high degree of etch uniformity and a high etch rate are achieved, in accordance with the invention, through the use of a plasma reactor apparatus employing three electrodes in combination with both a high frequency power source and a low frequency power source. One embodiment of apparatus in accordance with the invention is illustrated in cross section in FIG. 2. The apparatus includes a first electrode 10, a second electrode 12, and a third electrode 14. The first and third electrodes are generally circular and the second electrode is ring-shaped. Ring-shaped ceramic insulators 16 and 18 provide electrical isolation between the first and second and the second and third electrodes, respectively. Together the three electrodes and two ceramic rings bound a generally cylindrical reaction volume 20. Although not shown, the electrodes can be provided with temperature control means such as water cooling.

A gas inlet 22 provides for the ingress of reactants to the reaction volume. A gas outlet 24 provides for the egress of reaction products from the reaction volume under the influence of a vacuum pump (not shown). A top plate 26 and a clamp ring 28 mechanically hold the plasma reactor components together.

Lower electrode 14 is adapted for movement in the vertical direction. The electrode can be lowered to open the apparatus and to allow the placement of a workpiece within reaction volume 20. The workpiece can be placed directly on the electrode, which functions as a workpiece holder, and then the electrode raised to the closed position.

In accordance with the invention, a high frequency power supply 30 and a low frequency power supply 36 are coupled to the second and third electrodes, respectively, so that high and low frequency electric fields can be established within the reaction volume to act upon reaction gases which enter the reactor through inlet 22. In a preferred embodiment of the invention the top electrode 10 is coupled to ground. This electrode functions as the common ground for the system, being the ground reference for DC as well as high and low frequency AC supplies. The second electrode, the cylindrical ring electrode 12, is coupled to a high frequency AC power supply 30 through a matching network 32. Power, including both forward and reflected power, is monitored on a power meter 34. Lower electrode 14 is coupled to a low frequency AC power supply 36 through a matching network 38. Low frequency AC power is monitored on a power meter 40. The high frequency power supply is preferably at a frequency of about 13.56 MHz (a frequency allocated for industrial uses by the FCC) and the low frequency power supply is preferably at a frequency of about 100 KHz.

In one embodiment of the invention the lower electrode is also coupled to a DC supply 42. Use of a DC power supply allows the amount of DC biasing induced by the plasma to be changed, independently of pressure or power.

In a still further embodiment of the invention, a series circuit 44, including, for example, an inductor 46 and capacitor 48, tuned to the frequency of high frequency power supply 30, is coupled between lower electrode 14 and ground. Switch 49 permits the selective coupling of series circuit 44 to electrode 14.

During operation of the apparatus, in accordance with the invention, a workpiece, such as a semiconductor wafer, is placed on electrode 14 and the reaction volume is evacuated to a desired low pressure. Reactant gases are then admitted to the reaction chamber and the power supplies are energized. Either one or both AC power supplies can be energized, with or without the DC supply. Either AC supply creates a plasma within the reaction volume so that excited species of the reactant gas are created. Energizing high frequency supply 32 establishes an electric field which exists principally between upper electrode 10 and side electrode 12. Energizing low frequency power supply 36 creates a low frequency field which exists principally between lower electrode 14 and upper electrode 10. The combination of the two fields within the reaction volume and in proximity to the workpiece located on the lower electrode causes maximum dissociation of the reaction gas as well as imparting a high ion energy to the ions within the plasma.

The selective use of series circuit 44 by the closing of switch 49 has two effects. First, the tuned series circuit, which effectively places the lower electrode 14 at ground with respect to the high frequency supply, changes the electrode area ratio between the high frequency electrode and the ground electrode. This affects the plasma sheath potential above the wafer without physically changing the reactor. Second, coupling the series tank circuit to the lower electrode selectively couples the high frequency supply to the workpiece itself. This allows the optimizing of etch rates and etch selectivity for certain films. For example, the etch rate of silicon is high at low frequencies and drops off rapidly at high frequencies. In contrast, aluminum etches only slowly at low frequencies but etches rapidly at high frequencies. Thus, by selectively turning on or off the low frequency power supply and by selectively coupling or uncoupling the series circuit, the workpiece can be exposed to a high frequency, low frequency, or mixed frequency plasma.

Figure 3:
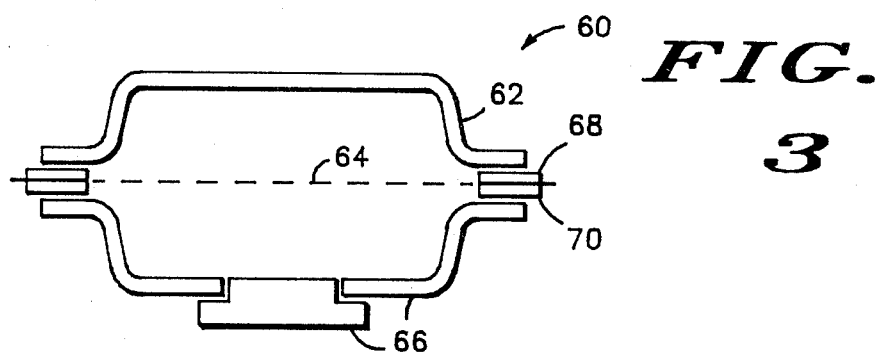
FIG. 3 schematically illustrates a second embodiment of plasma apparatus in accordance with the invention.

FIG. 3 schematically illustrates a further embodiment of the invention. In this embodiment a plasma reactor 60 includes a first top electrode 62, a screen electrode 64, and a bottom electrode 66. The bottom electrode can also function as a workpiece holder. Insulators 68 and 70 electrically isolate the three electrodes from each other.

Figure 4:
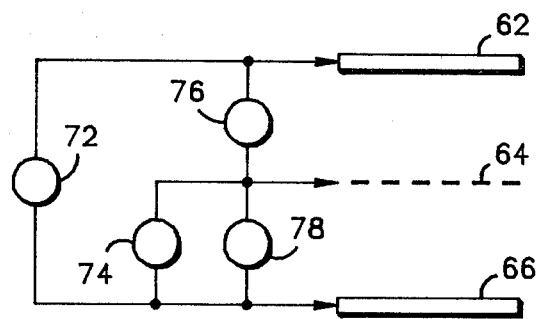
FIG. 4 illustrates coupling of the electrodes and power supplies of the second embodiment of the apparatus.

FIG. 4 schematically illustrates one way in which the three electrodes can be powered. A high frequency power supply 72 such as a supply at 13.56 MHz is coupled between electrodes 62 and 66. A low frequency power supply 74, such as a supply having a frequency of about 100 KHz is coupled between electrodes 64 and 66. In addition, DC supplies 76 and 78 are coupled between electrodes 62 and 64 and between electrodes 64 and 66, respectively. Each of the supplies can be turned on or off or adjusted in power to create the desired plasma and to establish the desired DC bias on one or more electrodes.

The following are non-limiting examples which serve to further illustrate practice of the invention and to disclose preferred embodiments contemplated by the inventor.

EXAMPLE I

Figure 2:
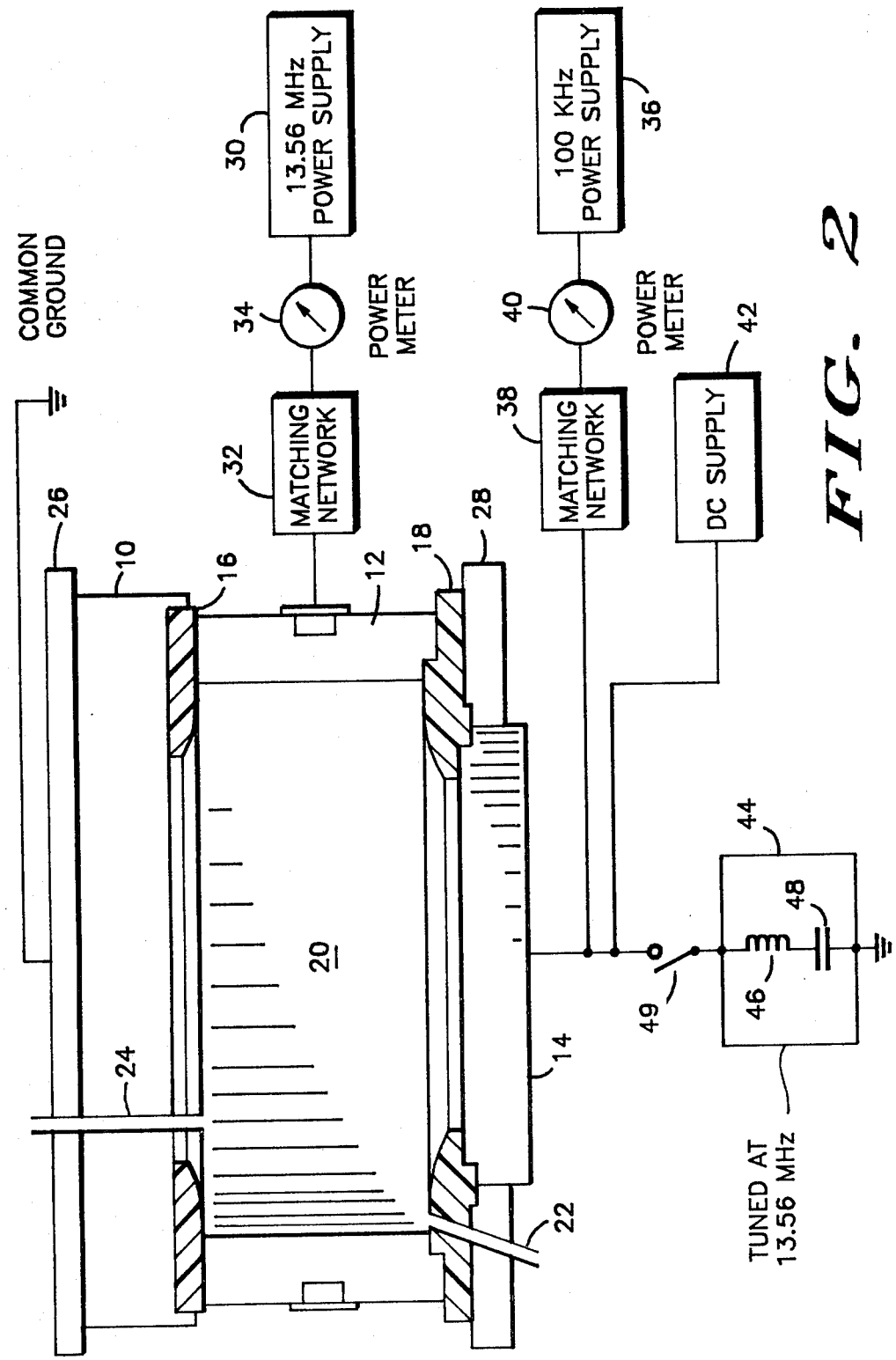
FIG. 2 illustrates in cross section one embodiment of plasma apparatus in accordance with the invention.

A plurality of silicon wafers were thermally oxidized to grow a silicon dioxide layer about 500 nm in thickness. Over the oxide layer was formed a layer of polycrystalline silicon, heavily doped with phosphorous and having a thickness of about 500 nm. A patterned photoresist etch mask was then formed on the layer of polycrystalline silicon. The wafers were divided into groups for the patterned plasma etching of the polycrystalline layer in a reactor as illustrated in FIG. 2. The polycrystalline layer was first etched in a mixture of $SF_6$ plus 10% $CCl_3F$. The pressure in the reactor was maintained at 0.25 torr. The AC power between the top and side electrodes was maintained at 100 watts CW at 13.56 MHz. The polycrystalline silicon was etched until end point was detected, approximately 40 seconds. The polycrystalline silicon layer was then given an overetch in $CCl_3F$ for about 18 seconds. During the overetch the high frequency power was maintained at 100 watts. One group of wafers was overetched with an additional DC bias of 100–150 volts applied to the wafer support electrode; one group was overetched without an additional DC bias. Wafers were examined after the etching. Those wafers overetched without a DC bias exhibited undercutting of the photoresist mask and a negative slope in the etched openings. That is, etched openings were narrower at the top of the polycrystalline silicon layer than at the bottom. Those wafers etched with a DC bias exhibited a decrease in undercutting and an increase in etched opening profile control. Additional groups of wafers were etched with a low frequency (100 KHz) supply coupled to the wafer support electrode. The low frequency plasma increased the anisotrophy of the polycrystalline silicon etch, but the etch selectivity of polycrystalline silicon over silicon dioxide decreased.

EXAMPLE II

A plurality of silicon wafers were thermally oxidized to grow a 500 nm thick layer of silicon dioxide. A layer of aluminum plus 4% copper was applied over the silicon dioxide to a thickness of 1000 nm. A patterned photoresist mask was formed over the Al/Cu layer. The wafers were divided into two groups for the etching of the alumimum. Both groups were etched in a $CCl_4$ plasma at 0.2–0.3 torr in a reactor as illustrated in FIG. 2. One group was etched using only a 13.56 MHz plasma with the high frequency plasma maintained at 125 watts CW. The second group was etched using an additional 100 KHz power supply maintained at 50-100 watts CW. The Al/Cu film etched about 30% faster when using the two power supplies than when using the high frequency power supply alone. In addition, using the two power supplies together resulted in a cleaner resultant wafer with less residue than when using the high frequency supply alone.

EXAMPLE III

A number of silicon wafers were thermally oxidized to grow a 500 nm layer of silicon dioxide. A patterned photoresist mask was formed over the oxide layer. The oxide layer was pattern etched in a $CF_4$ plasma at about 0.050 torr in a plasma apparatus as illustrated in FIG. 2. The wafers were divided into groups for etching. The first group was etched in a high frequency plasma (13.56 MHz, 200 watts). The etch rate of the oxide was measured to be 9.5 nm per minute. The second group was etched in a low frequency plasma (100 KHz, 200 watts). The etch rate of the oxide in the low frequency plasma was measured to be 93.7 nm per minute. The third group was etched in a high frequency/low frequency plasma (13.56 MHz, 200 watts; 100 KHz, 200 watts). The etch rate was measured to be 122.7 nm per minute. Additional groups were etched as above, but with a DC bias of up to 500 volts applied to the wafer holder electrode to reduce the natural DC bias established by the plasma. The wafers etched with the additional DC bias were found to have improved photoresist integrity and improved uniformity.

EXAMPLE IV

Wafers were prepared and etched as in Example III except that the AC power supplies were pulsed, with the high and low frequency power supplies operated alternately. One AC supply was operated for 1 msec., AC power off for 0.2 msec., the other AC power supply was operated for 1 msec., AC power off for 0.2 msec., and so on. The etch rates of the oxide were nearly the same as with continuously operated supplies and there was less attack of the photoresist. Very importantly, harmonics were not generated as is possible when simultaneously operating the two AC supplies.

Thus it is apparent that there has been provided, in accordance with the invention, an improved plasma reactor apparatus and method which fully meet the objects and advantages set forth above. While the invention has been described and illustrated with reference to specific embodiments thereof, it is not intended that the invention be so limited. Those skilled in the art, after consideration of the foregoing description, will recognize that many variations and modifications are possible which still fall within the broad scope of the invention. Such variations include the particular shape of the electrodes, positioning of gas inlets and outlets, reactant gases, and applications of the invention. It is intended that all such variations and modifications be included within the appended claims.

I claim:

1. A reactor apparatus including a reaction volume into which reactants are injected and from which reaction products are exhausted, and in which said reactants are acted upon by electric fields to form a plasma thereof, said apparatus comprising: first, second, and third electrodes, said first electrode coupled to electrical ground, said second electrode selectively coupled to a high frequency source of AC power, and said third electrode selectively coupled to a low frequency source of AC power.

2. The reactor of claim 1 wherein said third electrode is further coupled to a source of DC power.

3. The reactor of claim 1 wherein said third electrode is adapted for holding a workpiece.

4. The reactor of claim 3 wherein said third electrode is temperature controlled.

5. The reactor of claim 3 wherein said third electrode is water cooled.

6. The reactor of claim 1 further comprising means having a low impedance at the frequency of said high frequency source selectively coupled between said third electrode and electrical ground.

7. A plasma reactor apparatus comprising: first, second, and third electrodes; a first insulator electrically separating said first and second electrodes; a second insulator electrically separating said second and third electrodes; said electrodes and said insulators positioned to bound a reaction volume; means for admitting reactants to said reaction volume and for removing reaction products from said reaction volume; a first high frequency AC power supply selectively coupled to said second electrode; a second low frequency AC power supply selectively coupled to said third electrode; and an electrical ground coupled to said first electrode.

8. A method for etching a workpiece positioned in a plasma reactor apparatus which comprises the steps of: providing first, second, and third electrodes in said apparatus; injecting a reactant gas into said apparatus; and creating a reactant gas plasma by selectively applying a high frequency AC field between said first and second electrodes and a low frequency AC field between said first and third electrodes.

9. The method of claim 8 further comprising the step applying a DC bias between said first and third electrodes.

10. The method of claim 8 wherein said high frequency and said low frequency AC fields are pulsed.

11. The method of claim 10 wherein said low frequency and said high frequency AC fields are alternately applied.

* * * * *

REEXAMINATION CERTIFICATE (1447th)
United States Patent [19]

Gorin

[11] B1 4,464,223

[45] Certificate Issued Apr. 9, 1991

[4] PLASMA REACTOR APPARATUS AND METHOD

[75] Inventor: Georges J. Gorin, Pinole, Calif.

[73] Assignee: Tegal Corp., Novato, Calif.

Reexamination Requests:
No. 90/001,809, Jul. 14, 1989
No. 90/001,674, Dec. 20, 1988

Reexamination Certificate for:
Patent No.: 4,464,223
Issued: Aug. 7, 1984
Appl. No.: 538,593
Filed: Oct. 3, 1983

[51] Int. Cl.⁵ .................. H01L 21/312; B44C 1/22; C03C 15/00; C23F 1/02
[52] U.S. Cl. .................. 156/643; 156/646; 156/345; 204/192.32; 204/192.34; 204/298.34
[58] Field of Search ............. 156/345, 643, 646, 653, 156/656, 657, 659.1, 662, 665; 118/50.1, 728, 620, 625; 427/38, 39; 204/164, 192.32, 192.35, 298 TT, 298 E, 298 EP, 298 PP, 298 EM; 219/121.4, 121.41, 121.43, 121.52, 121.53

[56] References Cited

U.S. PATENT DOCUMENTS 2,468,174  4/1949  Cotton ............................ 204/312
3,458,817  7/1969  Cooper et al. .................. 325/180

FOREIGN PATENT DOCUMENTS 0026604  4/1981  European Pat. Off. .
52-127168  10/1977  Japan .

OTHER PUBLICATIONS

Chapman, "Triode Systems for Plasma Etching", IBM Technical Disclosure Bulletin, vol. 21, No. 12, May 1979, pp. 5006–5007.
"Triode Plasma Etching" Minkiewicz and Chapman, Appl. Phys. Lett. 34(3), Feb. 1979, p. 192.

Primary Examiner—William A. Powell

[57] ABSTRACT

An improved plasma reactor apparatus and method are disclosed. Improved uniformity of etching and etch rate are achieved in a reactor through the use of electrodes powered at high and low frequencies. In one embodiment of the invention the workpiece which is to be etched rests on an electrode powered at a low AC frequency of about 100 KHz. A second electrode is powered at a high AC frequency of about 13.56 MHz. A third electrode is maintained at ground potential. High and low frequency AC fields acting on a reactant material optimize the dissociation of the reactant material and the ion energy of the plasma generated reactant species.

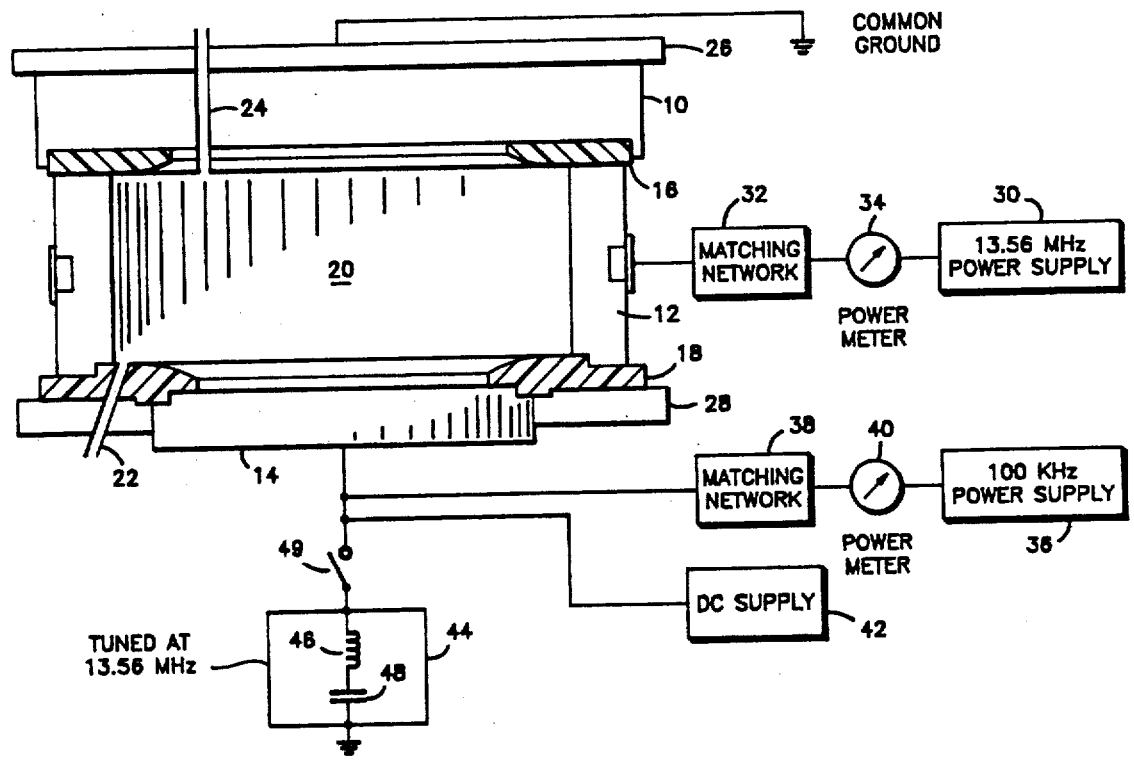

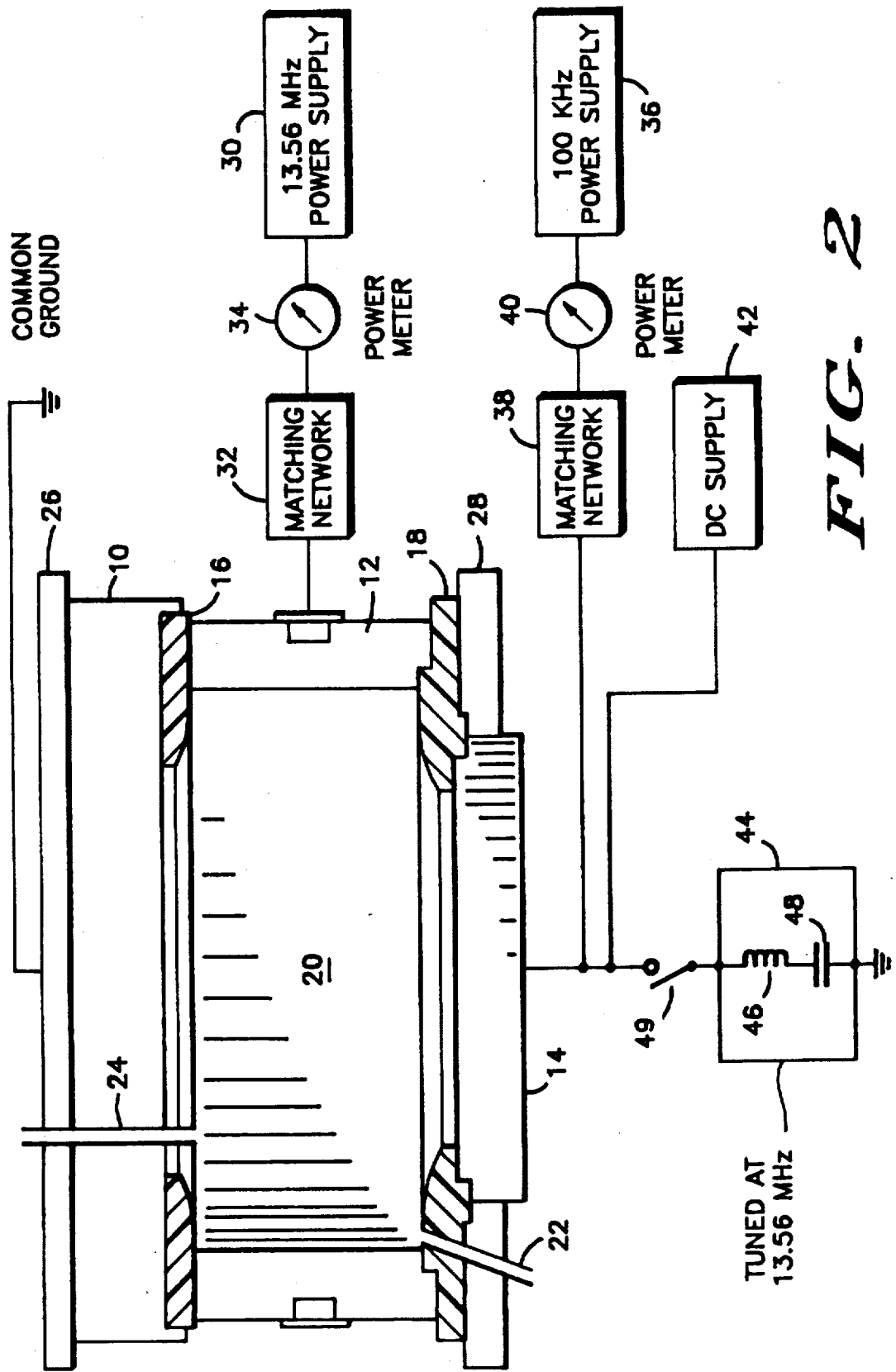

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 8-11 is confirmed.

Claim 3 is cancelled.

Claims 1, 2 and 4-7 are determined to be patentable as amended.

New claims 12-15 are added and determined to be patentable.

1. A reactor apparatus including a reaction volume into which reactants are injected and from which reaction products are exhausted, and in which said reactants are acted upon by electric fields to form a plasma thereof, said apparatus comprising:
   first, second, and third electrodes,
   said first electrode coupled to electrical ground,
   said second electrode selectively coupled to a high frequency source of AC power, [and]
   said third electrode selectively coupled to a low frequency source of AC power, and
   *wherein one of said electrodes is adapted for holding a workpiece.*

2. [The reactor of claim 1 wherein said third electrode is further coupled] *A reactor apparatus including a reaction volume into which reactants are injected and from which reaction products are exhausted, and in which said reactants are acted upon by electric fields to form a plasma thereof, said apparatus comprising:*
   *first, second, and third electrodes,*
   *said first electrode coupled to electrical ground,*
   *said second electrode selectively coupled to a high frequency source of AC power, and*
   *said third electrode selectively coupled to a low frequency source of AC power and* to a source of DC power.

4. The reactor of claim [3] *1* wherein said third electrode is *adapted for holding a workpiece and is* temperature controlled.

5. The reactor of claim [3] *1* wherein said third electrode is *adapted for holding a workpiece and is* water cooled.

6. [The reactor of claim 1 further comprising] *A reactor apparatus including a reaction volume into which reactants are injected and from which reaction products are exhausted, and in which said reactants are acted upon by electric fields to form a plasma thereof, said apparatus comprising:*
   *first, second, and third electrodes,*
   *said first electrode coupled to electrical ground,*
   *said second electrode selectively coupled to a high frequency source of AC power, and*
   *said third electrode selectively coupled to a low frequency source of AC power; and*
   means having a low impedance at the frequency of said high frequency source selectively coupled between said third electrode and electrical ground.

7. A plasma reactor [apparatus] *for treating a workpiece in a glow discharge* comprising:
   first, second, and third electrodes *separated by insulators for defining a reaction volume in which said workpiece is located;*
   [a first insulator electrically separating said first and second electrodes;
   a second insulator electrically separating said second and third electrodes;
   said electrodes and said insulators positioned to bound a reaction volume;]
   means for admitting reactants to said reaction volume and for removing reaction products from said reaction volume;
   a first high frequency AC power supply [selectively] coupled [to] *between said first electrode and* said second electrode;
   a second low frequency AC power supply [selectively] coupled [to] *between said first electrode and* said third electrode; [and]
   *an electrical ground coupled to said first electrode;*
   said first and second power supplies producing different frequencies respectively above about 10 Mhz and below about 1 Mhz for causing a glow discharge in said volume.

12. *The reactor of claim 1 wherein said first electrode is adapted for holding a workpiece.*

13. *The reactor of claim 1 wherein said second electrode is adapted for holding a workpiece.*

14. *The reactor of claim 1 wherein said third electrode is adapted for holding a workpiece.*

15. *The reactor of claim 1 wherein said second electrode is cylindrical and one of said first and third electrodes is adapted for holding a workpiece.*

* * * * *